United States Patent
Zhou et al.

(10) Patent No.: US 12,108,563 B2
(45) Date of Patent: Oct. 1, 2024

(54) POWER ELECTRONICS ASSEMBLIES HAVING EMBEDDED POWER ELECTRONICS DEVICES

(71) Applicant: Toyota Motor Engineering & Manufacturing North America, Inc., Plano, TX (US)

(72) Inventors: Feng Zhou, Ann Arbor, MI (US); Hiroshi Ukegawa, South Lyon, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 260 days.

(21) Appl. No.: 17/874,462

(22) Filed: Jul. 27, 2022

(65) Prior Publication Data

US 2024/0038624 A1    Feb. 1, 2024

(51) Int. Cl.
*H05K 7/20* (2006.01)
*H01L 23/373* (2006.01)
(Continued)

(52) U.S. Cl.
CPC ..... *H05K 7/20254* (2013.01); *H01L 23/3735* (2013.01); *H01L 23/473* (2013.01);
(Continued)

(58) Field of Classification Search
CPC .......... H05K 7/20254; H05K 7/20927; H05K 1/185; H05K 2201/10166;
(Continued)

(56) References Cited

U.S. PATENT DOCUMENTS

| 8,081,468 B2 | 12/2011 | Hill et al. | |
| 11,183,439 B2 | 11/2021 | Tsai et al. | |
| 11,665,813 B2 * | 5/2023 | Zhou | H05K 7/205 |
| | | | 361/719 |
| 11,690,173 B2 * | 6/2023 | Tseng | H05K 1/185 |
| | | | 361/761 |

(Continued)

FOREIGN PATENT DOCUMENTS

| CN | 201706427 U | 1/2011 |
| CN | 202025797 U | 11/2011 |

(Continued)

OTHER PUBLICATIONS

Developments for copper-graphite composite thermal cores for PCBs for high-reliability and high-temperature rf systems (https://meridian.allenpress.com/imaps-conferences/article-abstract/2016/HiTEC/000073/25801/Developments-for-Copper-Graphite-Composite-Thermal?redirectedFrom=fulltext), Jan. 1, 2016.

*Primary Examiner* — Zachary Pape
(74) *Attorney, Agent, or Firm* — DINSMORE & SHOHL LLP (57) ABSTRACT

Power electronics assemblies having embedded power electronics devices are disclosed. In one embodiment, a power electronics assembly includes a circuit board assembly that includes a substrate that is electrically insulating and a power electronics device assembly embedded in the substrate. The power electronics device assembly includes an S-cell that includes an inner graphite layer, a metal layer encasing the inner graphite layer, and a first surface of the metal layer comprising a recess provided within the first surface. The power electronics device assembly further includes a power electronics device disposed within the recess of the first surface.

20 Claims, 11 Drawing Sheets

(51) Int. Cl.
*H01L 23/473* (2006.01)
*H01L 23/538* (2006.01)
*H01L 25/07* (2006.01)
*H05K 1/18* (2006.01)

(52) U.S. Cl.
CPC ...... *H01L 23/5383* (2013.01); *H01L 23/5389* (2013.01); *H01L 25/072* (2013.01); *H05K 1/185* (2013.01); *H05K 7/20927* (2013.01); *H05K 2201/10166* (2013.01); *H05K 2201/10522* (2013.01)

(58) Field of Classification Search
CPC ...... H05K 2201/10522; H01L 23/3735; H01L 23/473; H01L 23/5383; H01L 23/5389; H01L 25/072
See application file for complete search history.

(56) References Cited

U.S. PATENT DOCUMENTS

| | | | |
|---|---|---|---|
| 11,910,521 B2* | 2/2024 | Zhou | H05K 1/0272 |
| 2009/0186195 A1 | 7/2009 | Spraker et al. | |
| 2016/0209133 A1* | 7/2016 | Hu | H01L 21/4882 |
| 2021/0321509 A1 | 10/2021 | Jung | |
| 2022/0053634 A1* | 2/2022 | Zhou | H01L 23/427 |
| 2023/0043071 A1* | 2/2023 | Wasserman | A61N 1/0496 |
| 2023/0247807 A1* | 8/2023 | Zhou | H05K 7/20927 |
| | | | 361/711 |

FOREIGN PATENT DOCUMENTS

| | | |
|---|---|---|
| CN | 105744718 A | 7/2016 |
| CN | 209515738 U | 10/2019 |
| CN | 111302834 B | 10/2020 |
| KR | 101049678 B1 | 7/2011 |

\* cited by examiner

POWER ELECTRONICS ASSEMBLIES HAVING EMBEDDED POWER ELECTRONICS DEVICES

TECHNICAL FIELD

The present specification generally relates to power electronic assemblies and, more specifically, apparatus and methods for power electronic assemblies having low overall thermal resistance while achieving a compact package size.

BACKGROUND

Due to the increased use of electronics in vehicles, there is a need to make electronic systems more compact. One component of these electronic systems is a power electronic device used as a switch in an inverter circuit. Power electronic devices have large cooling requirements due to significant heat generated.

Additionally, there has been a trend for power electronic devices conventionally composed of silicon to now be composed of silicon-carbide. The use of silicon-carbide causes a larger heat flux due to it defining a smaller device footprint. For these reasons, and more, there is a need to improve the cooling of power electronic devices while maintaining a compact package size.

SUMMARY

In one embodiment, a power electronics assembly includes a circuit board assembly that includes a substrate that is electrically insulating and a power electronics device assembly embedded in the substrate. The power electronics device assembly includes an S-cell that includes an inner graphite layer, a metal layer encasing the inner graphite layer, and a first surface of the metal layer comprising a recess provided within the first surface. The power electronics device assembly further includes a power electronics device disposed within the recess of the first surface.

In another embodiment, a power electronics assembly includes a circuit board assembly and a cold plate. The circuit board assembly includes a substrate that is electrically insulating and a plurality of power electronics device assemblies embedded in the substrate. Each power electronics device assembly includes an S-cell that further includes an inner graphite layer, a metal layer encasing the inner graphite layer, an insulation layer bonded to a second surface of the metal layer, and a first surface of the metal layer comprising a recess provided within the first surface. The power electronics device assembly further includes a power electronics device disposed within the recess of the first surface The circuit board assembly further includes a surface metal layer on a surface of the substrate and a plurality of thermal vias thermally coupling the S-cell to the surface metal layer. The surface metal layer of the circuit board assembly is bonded to a first surface of the cold plate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are generally directed to power electronics assemblies having one or more power electronics device assemblies embedded directly into a circuit board, such as a printed circuit board. By fully embedding the one or more power electronics device assemblies in the circuit board, a thermal grease layer between the circuit board and a cold plate of the power electronics assembly may be removed. Removal of the thermal grease layer reduces the thermal resistance between the power electronics devices and the cold plate, thereby improving thermal performance.

The power electronics device assemblies of the present disclosure comprise a power electronics device affixed to a mounting substrate referred to herein as an S-cell. As described in more detail below, the S-cell includes a graphite layer that provides enhanced heat spreading capabilities. Further, embodiments of the present disclosure include one or more electrical isolation layers that electrically isolate the power electronics device(s) that from a cold plate. For example, an electrically insulating layer of the S-cell enables the removal of an electrical insulation layer between the printed circuit board and the cold plate because the electrical isolation is provided by the S-cell itself.

As described in more detail below, the S-cells of the present disclosure provide enhanced thermal properties due to a graphite layer that promotes heat flux flow toward a cold plate.

The power electronic device assemblies, the circuit board assemblies, and the power electronics assemblies described herein may be used in electrified vehicles, such as and without being limited to, an electric vehicle, a hybrid electric vehicle, any electric motor, generators, industrial tools, household appliances, and the like. The power electronics assemblies described herein may be electrically coupled to an electric motor and/or a battery and be configured as an inverter circuit operable to convert direct current (DC) electrical power to alternating current (AC) electrical power.

As used herein, a "power electronics device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, the phrase "fully embedded" means that each surface of a component is surrounded by a substrate. For example, when a power electronics device assembly is fully embedded by a circuit board substrate, it means that the material of the circuit board substrate covers each surface of the circuit board substrate. A component is "partially embedded" when one or more surfaces of the component are exposed.

As used herein, an "S-cell" is a mounting substrate operable to be affixed to a power electronics device and includes at least a metal layer (e.g., copper) surrounding a graphite layer.

Various embodiments of power electronics device assemblies, circuit board assemblies, and power electronics assemblies are described in detail below. Whenever possible, the same reference numerals will be used throughout the drawings to refer to the same or like parts.

Figure 1:
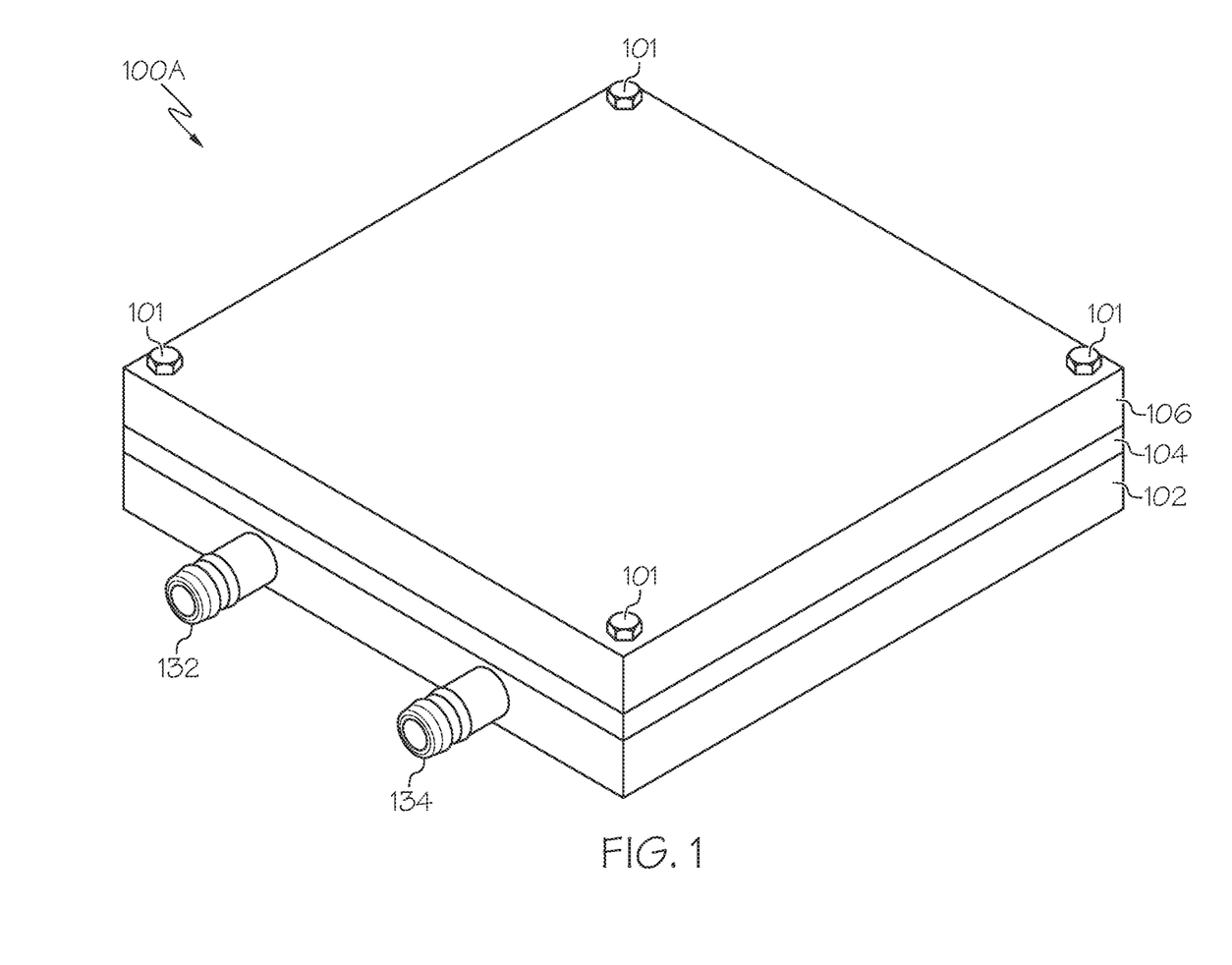
FIG. 1 schematically depicts a perspective view of a power electronics assembly according to one or more embodiments described and illustrated herein.
Figure 2:
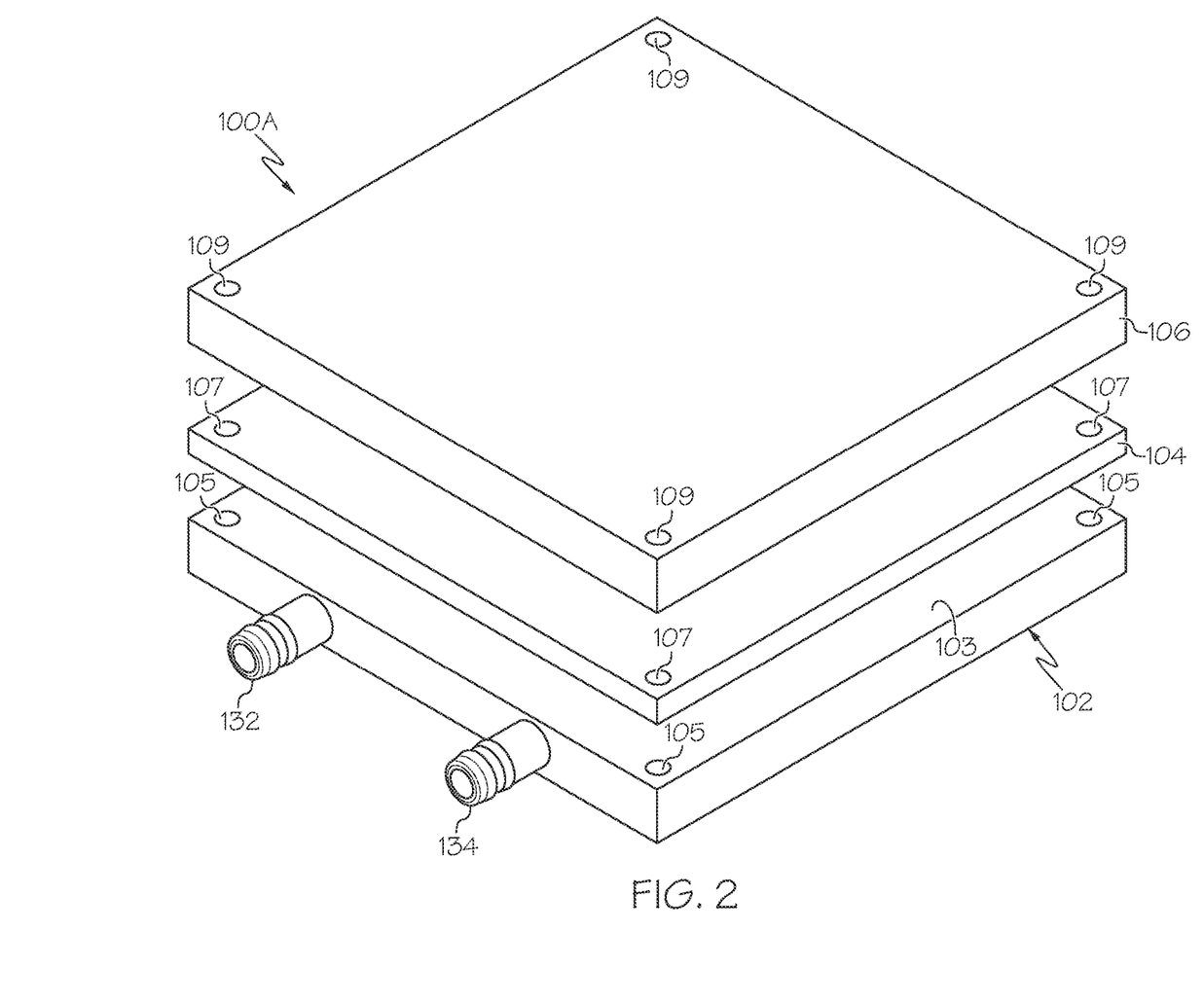
FIG. 2 schematically depicts an exploded perspective view of the example power electronics assembly illustrated by FIG. 1 according to one or more embodiments described and illustrated herein.
Figure 3:
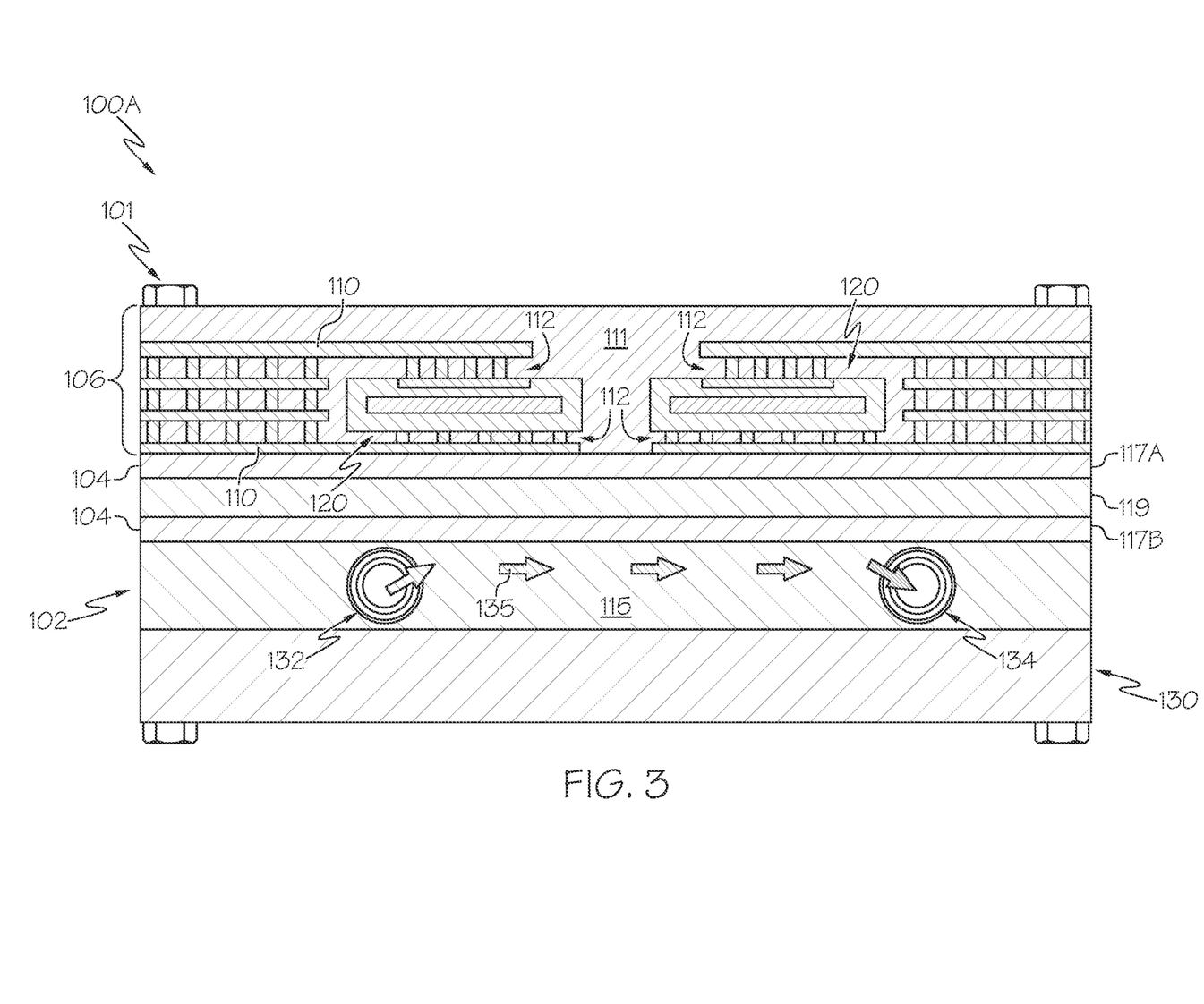
FIG. 3 schematically depicts a cross-sectional view of an example power electronics assembly according to one or more embodiments described and illustrated herein.

Referring now to FIGS. 1 and 2, an example power electronics assembly 100 is illustrated in an assembled view and an exploded view, respectively. The power electronics assembly 100 illustrated by FIGS. 1 and 2 include a cold plate 102, a bond layer 104, and a circuit board assembly 106. The cold plate 102 may be any device capable of removing heat flux from power electronics devices 140 (see e.g., FIG. 3) embedded within a substrate material of the circuit board assembly 106. Non-limiting examples for the cold plate include heat sinks, single-phase liquid cooling, two-phase liquid cooling, a vapor chambers. FIGS. 1 and 2 illustrate the cold plate 102 as being configured as a single-phase liquid cooling device. The cold plate 102 includes a fluid inlet 132 and a fluid outlet 134 fluidly coupled to a fluid chamber 115 within the cold plate 102. Referring briefly to FIG. 3, cooling fluid 135 from a reservoir (not shown) flows into the fluid chamber 115 through the fluid inlet 132 and out of the fluid chamber 115 through the fluid outlet 134, where it is returned to the reservoir, such as after flowing through a heat exchanger (not shown) to remove heat from the cooling fluid. Although not shown, an array of fins may be provided in the fluid chamber 115 to provide additional surface area for heat transfer to the cooling fluid 135. As shown in FIG. 3, cold cooling fluid 135 enters the cold plate 102 through the fluid inlet 132, flows through the fluid chamber 115, and exits as warmed cooling fluid out of the fluid outlet 134.

The circuit board assembly 106 is affixed to a first surface 103 of the cold plate 102. FIGS. 1 and 2 illustrate the circuit board assembly 106 as being affixed to the first surface 103 of the cold plate 102 by way of fasteners 101 (e.g., bolts and nuts) disposed through through-holes 105 of the cold plate 102, through-holes 107 of the bond layer 104, and through-holes of the circuit board assembly 106. When fasteners 101 are used, the bond layer 104 may be a thermal grease layer to lower the thermal resistance between the circuit board assembly 106 and cold plate 102.

In other embodiments, the circuit board assembly 106 is affixed to the first surface 103 of the cold plate 102 by a bond layer 104 configured as a solder layer. For example, the bottom surface of the circuit board assembly 106 may include a metal layer that enables the circuit board assembly 106 to be affixed to the first surface 103 of the cold plate 102 by a solder layer. It should be understood that other bonding methods may be utilized.

Referring now to FIG. 3, a cross-sectional view of the example power electronics assembly 100A is illustrated. In the illustrated embodiment, an additional electrical component 130 is affixed to a second surface of the cold plate 102. As a non-limiting example, the additional electrical component 130 may be a capacitor of an inverter circuit, for example. It should be understood that an additional electrical component 130 may not be affixed to the cold plate 102 in other embodiments.

The circuit board assembly 106 comprises a substrate 111 made of an electrically insulating material. The electrically insulating material may be a material used in the fabrication of printed circuit boards, such as, without limitation, FR-4. The circuit board assembly 106 further comprises embedded metal layers 110 (or other electrically conductive layers), a plurality of vias 112 (e.g., both electrically conducting vias and thermal vias), and a plurality of power electronics device assemblies 120.

As a non-limiting example, the circuit board assembly 106 may include six power electronics device assemblies 120 for an inverter circuit for an electric vehicle. However, it should be understood that any number of power electronics device assemblies may be utilized depending on the application.

Each power electronics device assembly 120 includes an S-cell 121 and a power electronics device 140 affixed to the S-cell 121. As stated above, the S-cell 121 is a substrate to which the power electronics device 140 is affixed. It provides an electrically conductive surface to make connections to electrodes on the bottom surface of the power electronics device 140. The S-cell 121 further provides heat spreading functionality.

Figure 4:
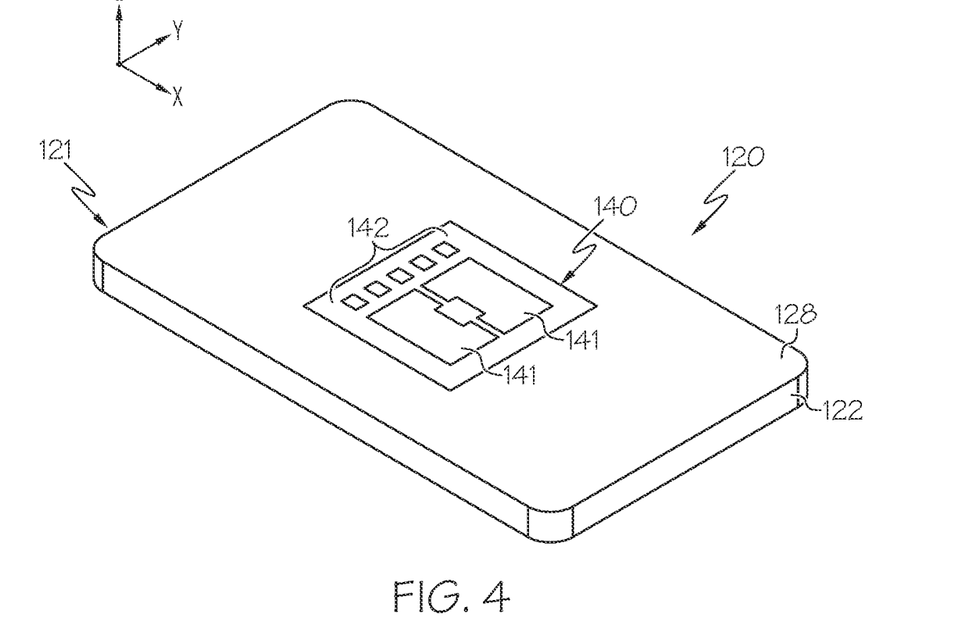
FIG. 4 schematically illustrates a top perspective view of an example S-cell according to one or more embodiments described and illustrated herein.
Figure 5:
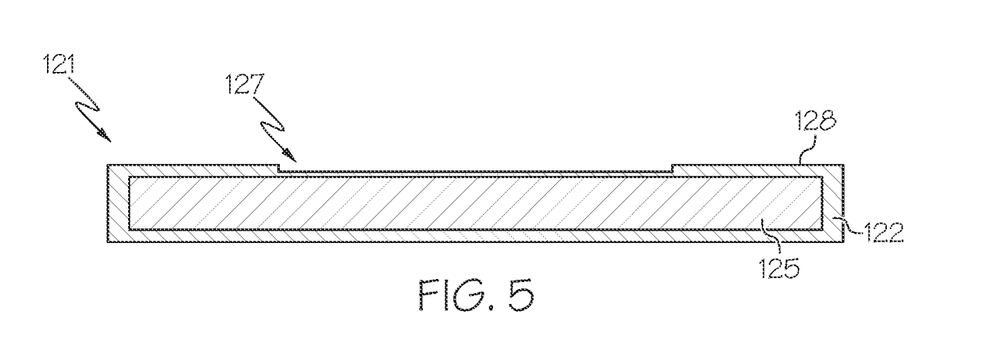
FIG. 5 schematically illustrates a cross-sectional view of an example S-cell according to one or more embodiments described and illustrated herein.

FIGS. 4 and 5 illustrate an example S-cell 121 in a top perspective view and a cross-sectional view, respectively. The S-cell 121 illustrated by FIGS. 4 and 5 includes an internal graphite layer 125 that is encapsulated by a metal layer 122. The metal layer 122 includes a surface 128 having a recess 127 with dimensions to receive a power electronics device 140. As described in more detail below, the metal layer 122 provides an electrically conductive surface 128 to which electrically conductive vias may contact to make an electrical connection to electrodes on a bottom surface of the power electronics device 140. The recess 127 may be formed by chemical etching, for example.

The metal layers 122 may be made of any suitable metal or alloy. Copper and aluminum may be used as the metal layer 122 as non-limiting examples.

The graphite layer 125 is provided to encourage heat spreading both across the S-cell 121 as well as toward the cold plate 102. The crystalline structure of graphite provides it with high thermal conductivity making it useful to conduct heat flux toward the cold plate 102. However, graphite does not have an isothermal profile. Rather, graphite has an anisothermal profile with high conductivity along two axes and low thermal conductivity in a third axis. To account for the anisothermal profile of graphite, the S-cell 121 is designed to be rectangular in shape such that its length dimension is larger than its width dimension. Referring to FIG. 4, the graphite layer 125 has high thermal conductivity along the x-axis and the z-axis. Thus, the S-cell 121 is designed such that its length dimension along the x-axis is larger than its width dimension along the y-axis. Heat flux will preferentially travel along the x- and z-axes. As described in more detail below, thermal vias 112 may be provided at the edges of the S-cell along the x-axis to receive heat flux and move it toward the cold plate 102. Heat flux will also travel along the z-axis toward the cold plate 102.

Referring once again to FIG. 3, electrical connection to the plurality of electrodes 141, 142 and the metal layer 122 may be made by a plurality of vias 112. These vias may provide drive signals to the power electronics devices 140, as well as provide a current path for switching current. It is noted that, in some embodiments, some of the vias 112 may be configured as thermal vias that do not conduct drive signals or switching current.

The circuit board assembly 106 is bonded to the cold plate 102 by a bond layer 104. In the embodiment illustrated by FIG. 3, the bond layer 104 provides both a mechanical bond between the circuit board assembly 106 and the cold plate 102 as well as electrical insulation between the circuit board assembly 106 and the cold plate 102. The bond layer 104 of FIG. 3 is a reactive multilayer system (RMS) bond layer having electrically isolating properties. In an RMS bonding process, a stacked layer of foils, such as metal foils and electrically insolating material foils, are put into a reacted state by an ignition spark, which creates a reaction that causes intermetallic bonds. The reacted RMS bond layer bonds the circuit board assembly 106, which has a metal bottom surface (e.g., in the form of an exposed metal layer 110), to the cold plate 102, which is also metal (e.g., aluminum or copper). In some embodiments, a first metal layer 117A is provided on the circuit board assembly 106 and a second metal layer 117B is provided on the cold plate 102 to enhance bonding. For example, the first and second metal layers 117A, 117B may each be a solder layer or a brazing layer.

The RMS bond layer 104 provides excellent thermal properties thereby allowing heat flux to travel from the power electronics devices 140 to the cold plate 102, as well as electrical isolation. By providing a bond layer 104 that not only bonds the circuit board assembly 106 to the cold plate 102 but also provides electrical insulation, a separate, dedicated electrical insulation layer is not needed. This reduces the overall size of the power electronics assembly 100A package. The overall size of the power electronics assembly 100A package is further reduced by embedding the power electronics device assemblies 120 inside of the circuit board assembly 106.

Figure 6:
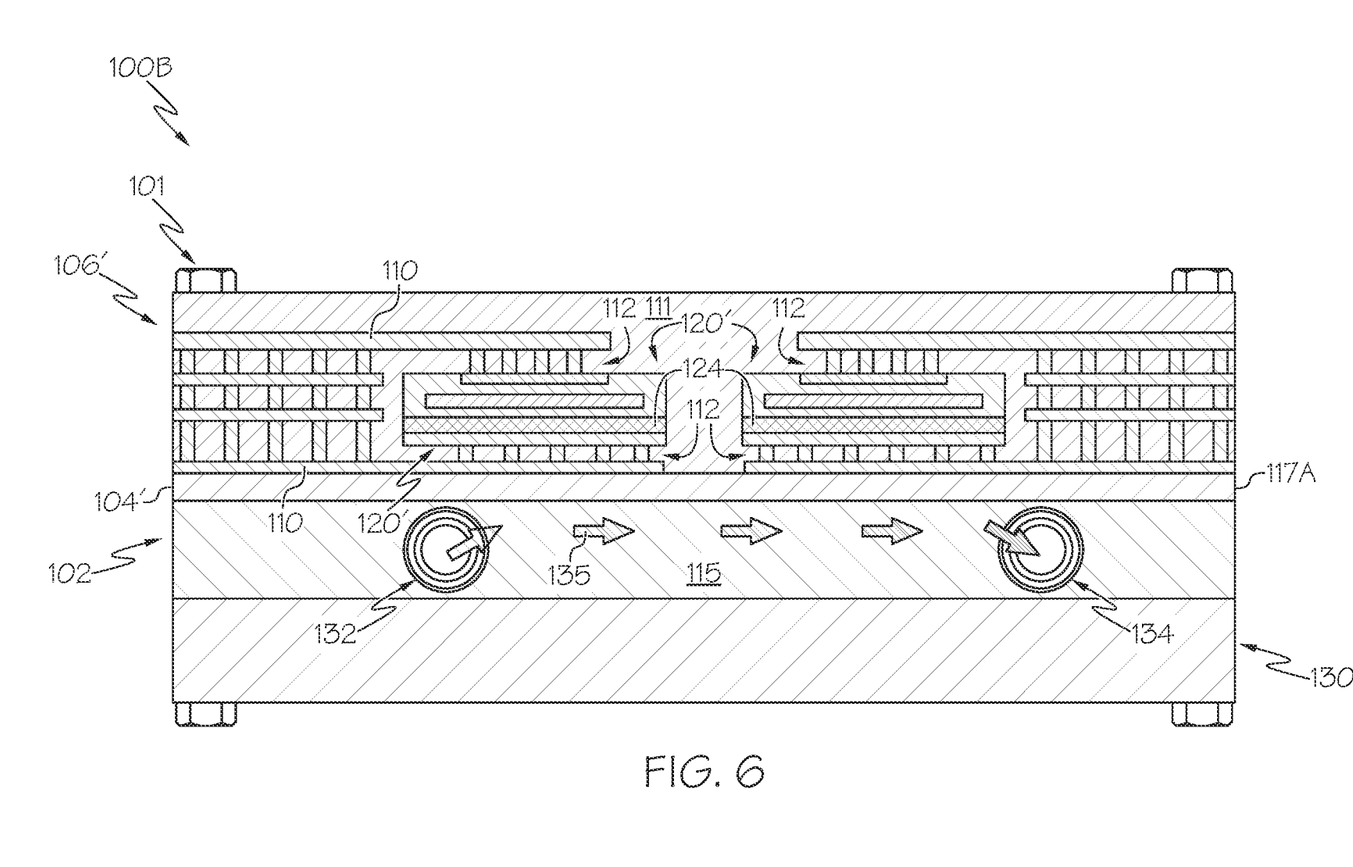
FIG. 6 schematically illustrates a cross-sectional view of another example power electronics assembly according to one or more embodiments described and illustrated herein.

Referring now to FIG. 6, another power electronics device assembly 100B is illustrated. Rather than providing electrical isolation by a bond layer as depicted in FIGS. 1-3, electrical isolation between the circuit board assembly 106' and the cold plate 102 is provided by a metalized insulation layer 124 of an S-cell 121' of one or more power electronics device assemblies 120'.

The bond layer 104' of the embodiment shown by FIG. 6 may be configured as any bond layer, such as, without limitation, a solder layer, a brazing layer, or a RMS bond layer. One or more exposed metal layers 110 (e.g., copper layers) provide a metal surface of the circuit board assembly 106' to which the bond layer 104' is bonded to. In some embodiments, the bond layer 104' may be a thermal grease layer as the assembly 100B is held together by fasteners 101. Thermal vias 112 extend from the bottom of the power electronics device assembly 120' toward the bottom of the circuit board assembly 106' to provide a thermal path for heat flux generated by the power electronics devices 140.

Figure 7:
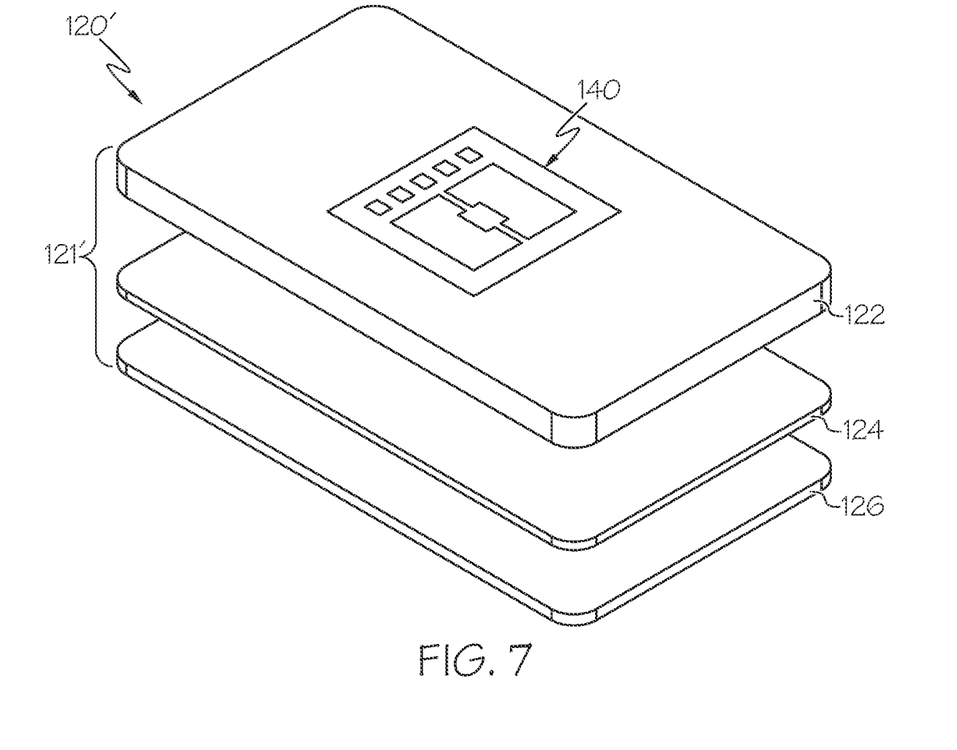
FIG. 7 schematically illustrates a partially exploded view of an example power electronics device assembly of the power electronics assembly illustrated by FIG. 6 according to one or more embodiments described and illustrated herein.
Figure 8:
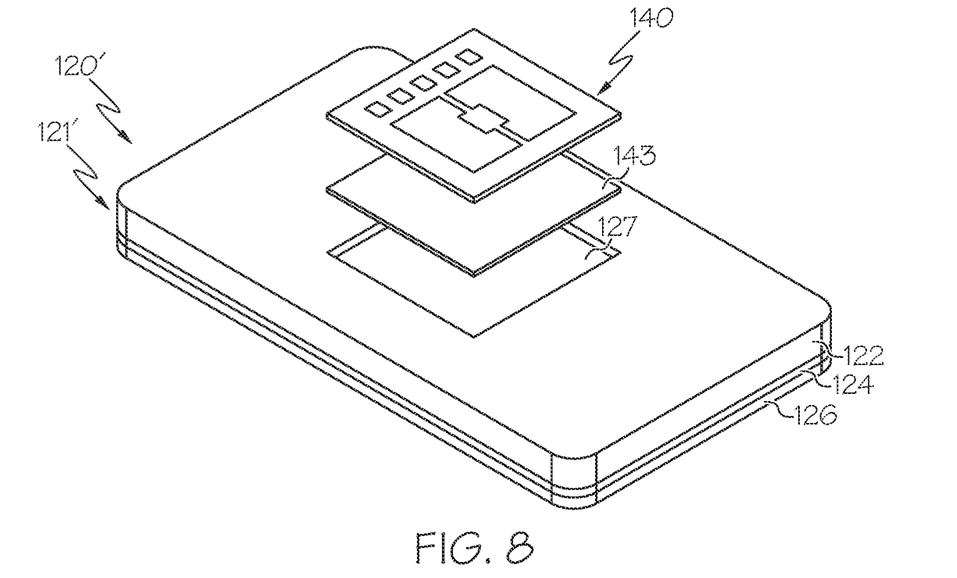
FIG. 8 schematically illustrates another partially exploded view of the example power electronics device illustrated by FIG. 7 according to one or more embodiments described and illustrated herein.
Figure 9:
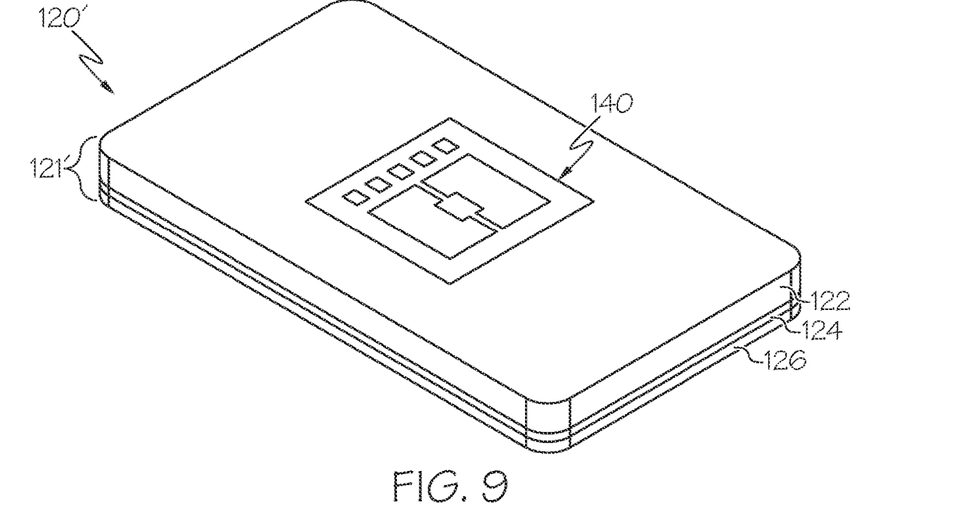
FIG. 9 schematically illustrates a perspective, assembled view of the example power electronics device illustrated by FIG. 7 according to one or more embodiments described and illustrated herein.
Figure 10:
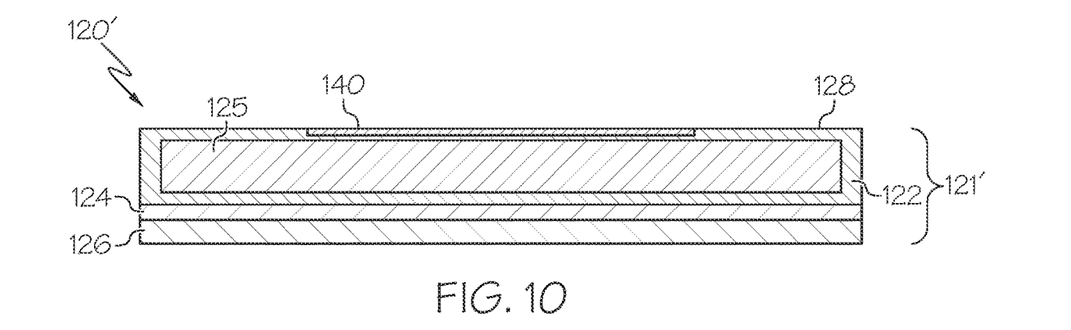
FIG. 10 schematically illustrates a cross-sectional view of the example power electronics device illustrated by FIG. 7 according to one or more embodiments described and illustrated herein.

FIGS. 7 and 8 illustrate partially exploded views of an example power electronics device assembly 120' of FIG. 6, while FIG. 9 is a top perspective view and FIG. 10 is a cross-sectional view of the example power electronics device assembly 120'. The power electronics device assembly 120' includes a power electronics device 140 affixed to an S-cell 121'. Referring generally to FIGS. 7-10, the S-cell 121' comprises an internal graphite layer 125 that is encapsulated by a metal layer 122, such as a copper layer. The metal layer 122 includes a surface 128 having a recess 127 with dimensions to receive the power electronics device 140. As stated above, the graphite layer 125 provides enhanced thermal properties.

FIG. 7 depicts the power electronics device 140 and a bond layer 143 with respect to the recess 127. The bond layer 143, which affixes the power electronics device 140 to the metal layer 122, may be a solder layer, for example. As another example, the bond layer 143 may be a transient liquid phase bond layer 143. The power electronics device 140 includes a plurality of electrodes 141, 142 on its top surface. The large electrodes 141 may be power electrodes, while the smaller electrodes 142 may be signal electrodes. It is noted that, although not visible in FIGS. 7-10, the power electronics device 140 further includes one or more electrodes on its bottom surface. The one or more electrodes on the bottom surface of the power electronics device are electrically connected to the second metal layer 126 by placement of the power electronics device 140 into the recess 127. Thus, electrical connection to the bottom electrodes of the power electronics device 140 may be made by way of the second metal layer 126.

The S-cell 121' further comprises a metalized insulation layer 124 that provides electrical isolation between the metal layer 122 and the cold plate 102. The metalized insulation layer 124 is metalized such that it may be bonded to the metal layer 122. The metalized insulation layer 124 may be made from any electrically insulating material, such as, without limitation, a ceramic material. As a non-limiting example, the metalized insulation layer 124 may be metalized alumina. The metallization of the insulation material of the metalized insulation layer 124 enables it to be bonded. It is noted that the major surfaces of the metalized insulation layer 124 should be metalized but the side edges should not be to prevent electrical shorting.

The example S-cell 121' further comprises a second metal layer 126 that is bonded to the metalized insulation layer 124. The metalized insulation layer 124 may be bonded to the metal layer 122 and the second metal layer 126 by any bonding technique. The second metal layer 126 provides additional heat spreading, as well as a thermal connection point for thermal vias 112 to move thermal flux toward a bottom metal layer 110 and ultimately a cold plate 102, as shown by FIG. 6. For example, the vias 112 shown contacting the second metal 126 of the S-cells 121' may be thermally conductive-only vias that are provided to conduct heat flux toward a bottom layer that is close to the cold plate 102. Additionally, thermal vias 112 may be electrically coupled to ends of a top surface of the metal layer 122 to move heat flux from the metal layer 122 down toward the cold plate 102. In this way, heat flux is optimally directed away from the power electronics devices 140 and toward the cold plate 102.

Figure 11:
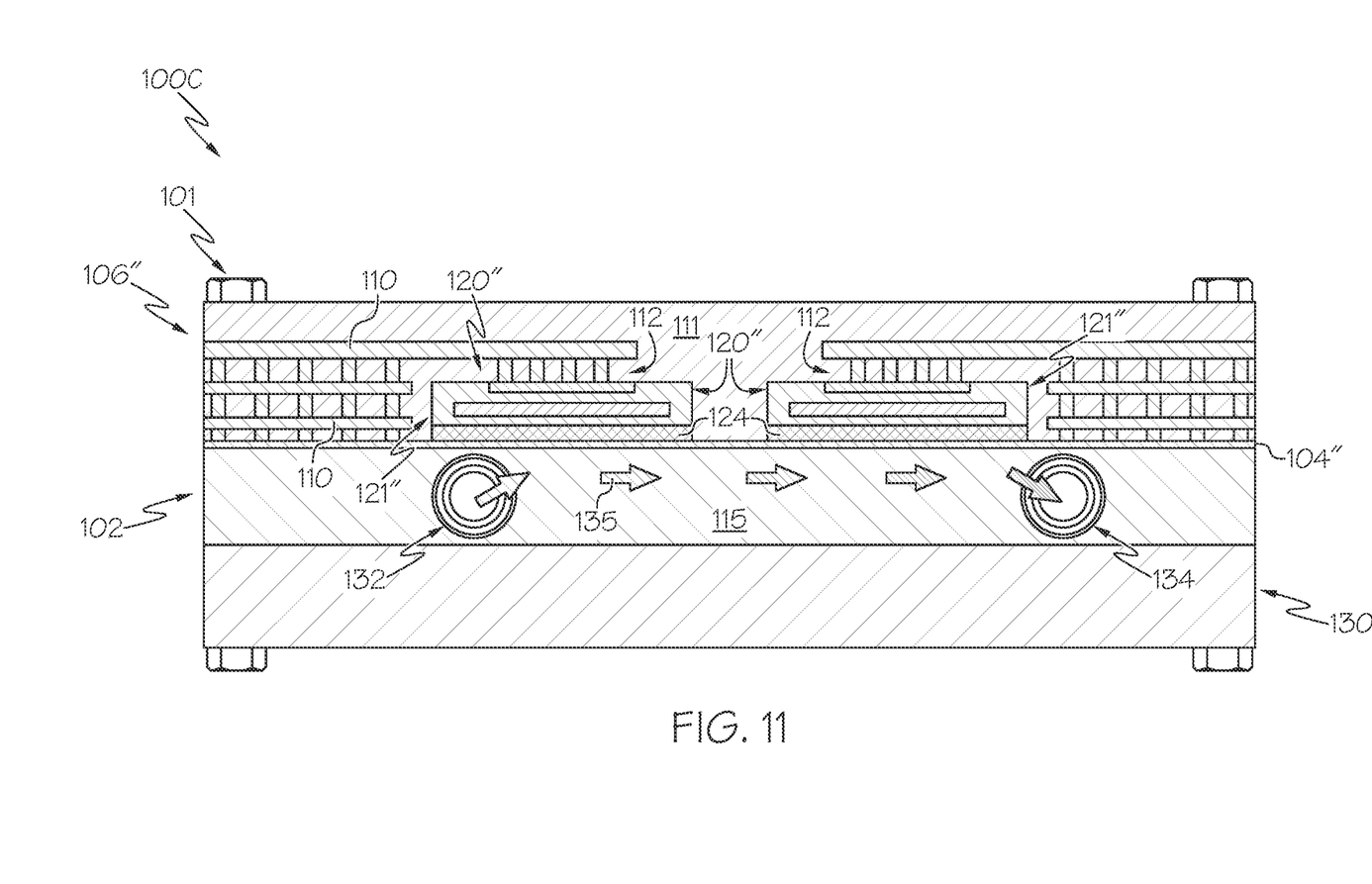
FIG. 11 schematically illustrates a cross-sectional view of another example power electronics assembly according to one or more embodiments described and illustrated herein.

FIG. 11 illustrates a power electronics device assembly 110C similar to that of FIG. 6 except the S-cells 121" of the power electronics device assemblies 120" do not include a second metal layer. Rather, the metalized insulation layer 124 of each S-cell 121" is exposed by the substrate 111 material of the circuit board assembly 106". Exposure of the metalized insulation layer 124 provides for the ability of the circuit board assembly 106" to be bonded to the surface of the cold plate 102 at the metalized insulation layer 124 directly rather than by intervening layers. For example, the circuit board assembly 106" may be bonded by a bond layer 104" (e.g., a solder layer) that bonds one or more metal layers 110 and the metalized insulation layers 124 to the surface of the cold plate 102. This may be advantageous because it may reduce the size of the power electronics device assembly 110C.

Figure 12:
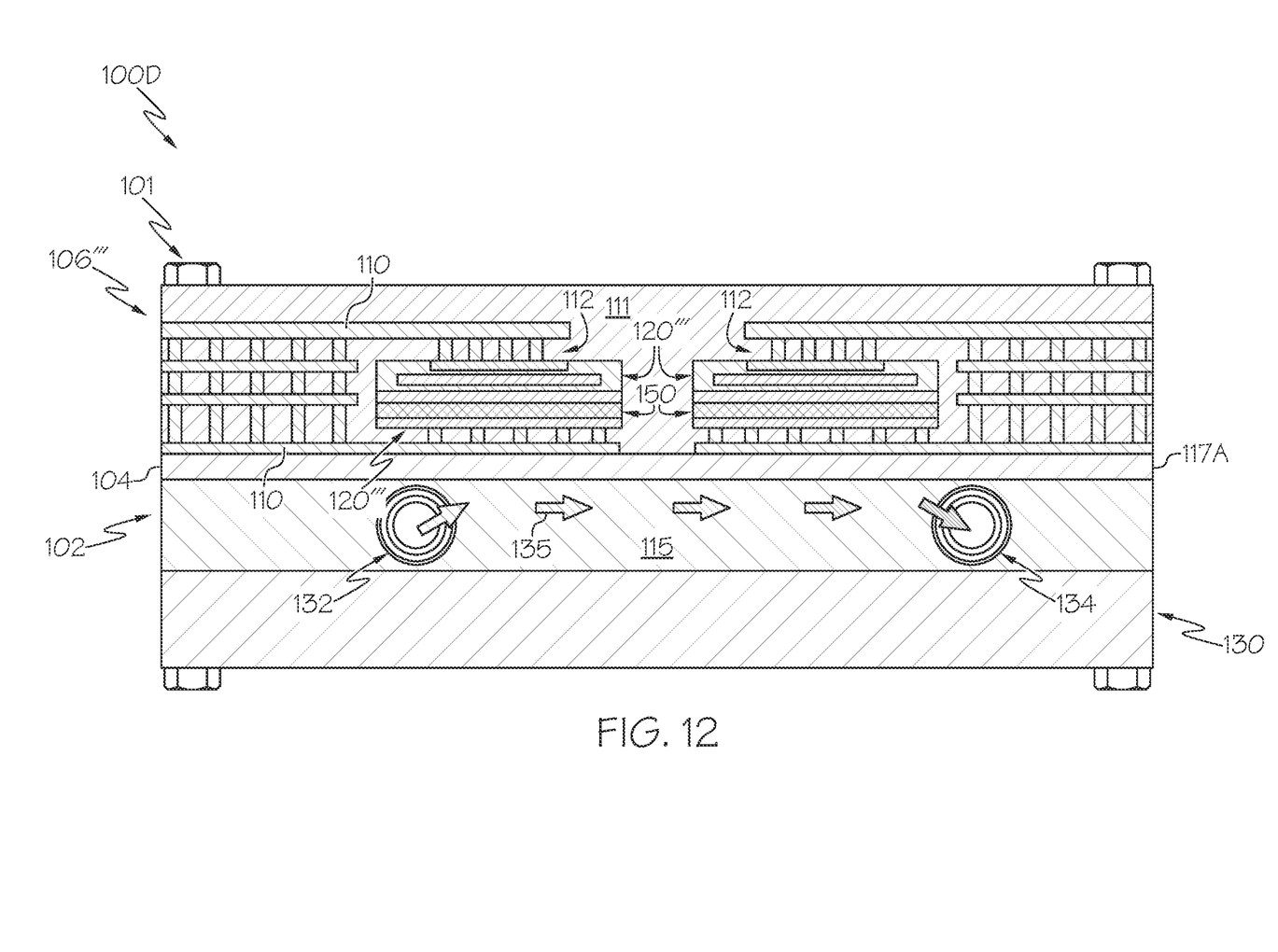
FIG. 12 schematically illustrates a cross-sectional view of another example power electronics assembly according to one or more embodiments described and illustrated herein.

FIG. 12 illustrates a power electronics assembly 100D similar to the power electronics assembly 100B illustrated by FIG. 6. Rather than electrical isolation being provided by a metalized insulation layer 124, electrical isolation of the power electronics assembly 100D is provided by a direct-bonded-metal substrate 150 layer of an S-cell 121''' of a power electronics device assembly 120'''.

Figure 13:
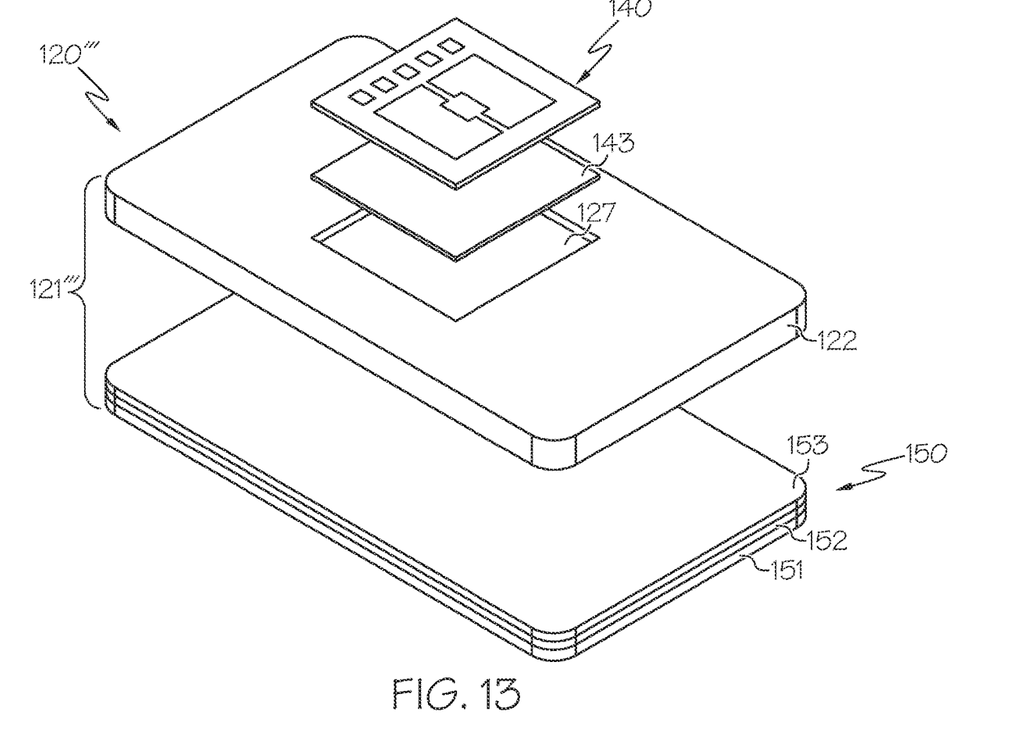
FIG. 13 schematically illustrates a partially exploded view of an example power electronics device assembly of the power electronics assembly illustrated by FIG. 12 according to one or more embodiments described and illustrated herein.
Figure 14:
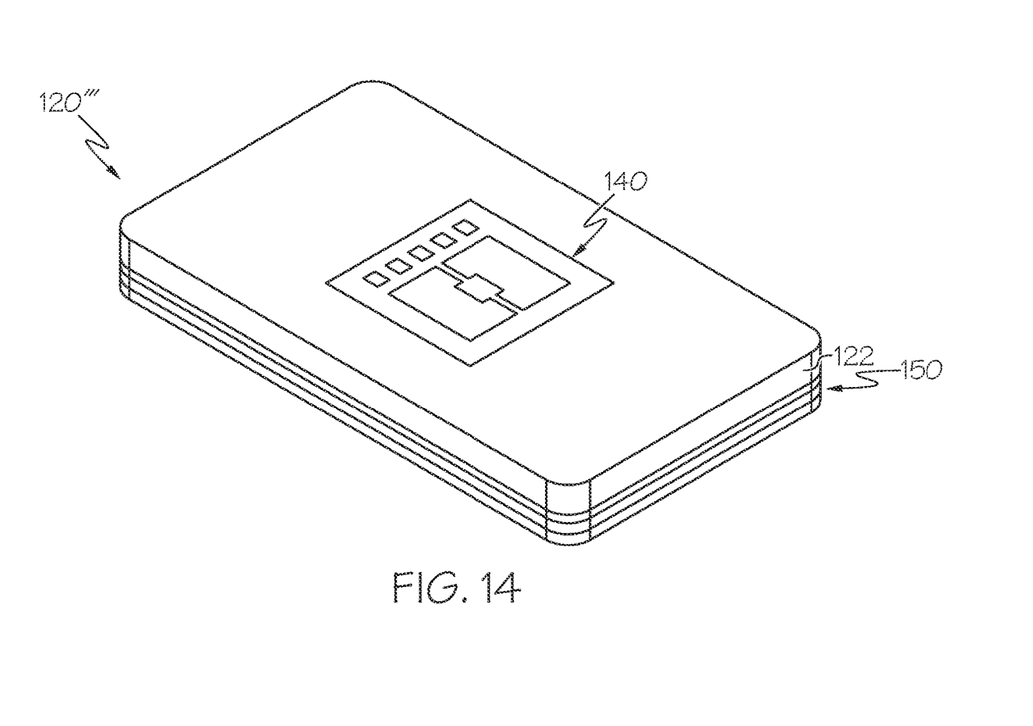
FIG. 14 schematically illustrates a perspective, assembled view of the example power electronics device illustrated by FIG. 13 according to one or more embodiments described and illustrated herein.
Figure 15:
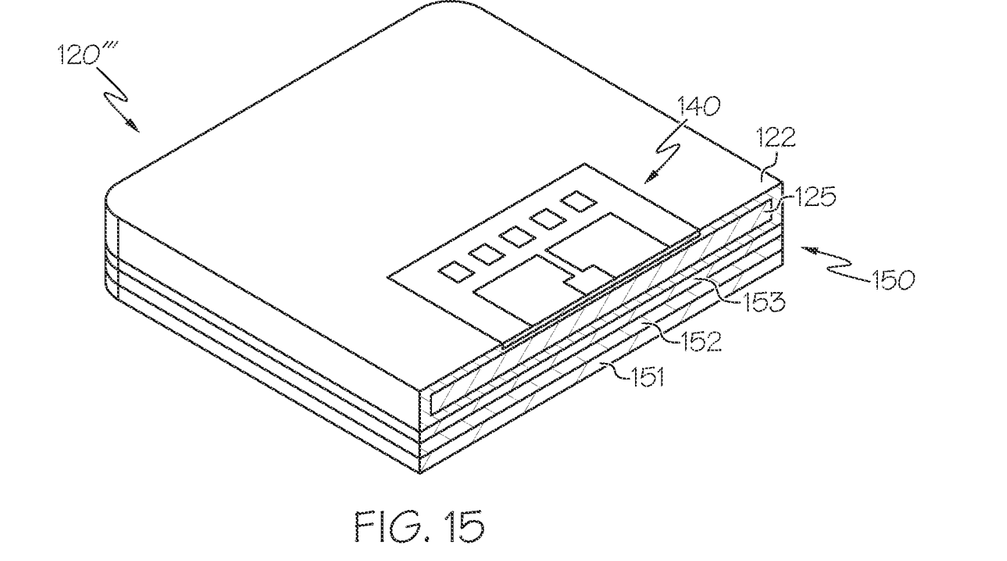
FIG. 15 schematically illustrates a cutaway, perspective view of the example power electronics device illustrated by FIG. 13 according to one or more embodiments described and illustrated herein.

FIG. 13 illustrates a partially exploded view of an example power electronics device assembly 120''' comprising a power electronics device 140 affixed to a recess 127 of an S-cell 121''' by a bond layer 143. FIG. 14 illustrates an assembled perspective view of the power electronics device assembly 120'''. FIG. 15 is a cutaway perspective view of the power electronics device assembly 120'''. Referring to FIGS. 13-15, the example S-cell 121''' includes a graphite layer 125 that is encapsulated by a metal layer 122. The S-cell 121''' further includes a direct-bonded-metal (DBM) substrate 150 that is bonded to a bottom surface of the metal layer 122. The DBM substrate 150 may be a direct-bonded-copper (DBC) substrate, for example. The DBM substrate 150 has an insulation layer 152, which may be a ceramic material, such as alumina. The DBM substrate 150 also has a first DBM metal layer 151 directly bonded to a first surface of the insulation layer 152 (e.g., a ceramic layer) and a second DBM metal layer 153 directly bonded to a second surface of the insulation layer 152.

The second DBM metal layer 153, which may be copper, is bonded to a bottom surface of the metal layer 122. The insulation layer 152 provides electrical insulation for the power electronic device.

Referring once again to FIG. 12, a plurality of thermal vias 112 contact the first DBM layer 151 and extend toward a bottom metal layer 110 to bring heat flux from the S-cell 121''' to a bottom of the circuit board assembly 106'''. The circuit board assembly 106''' may then be bonded at the exposed metal layer 110 to a surface of the cold plate 102 by a bond layer 104, which may be a solder layer, for example.

Like the power electronics assembly of FIG. 11, in some embodiments the first DBM layer 151 may be exposed by the substrate 111 material of the circuit board assembly 106'''. In such embodiments, the circuit board assembly 106''' may be bonded to the surface of the cold plate 102 at the first DBM layer 151 rather than an intervening metal layer.

It should now be understood that embodiments of the present disclosure are directed to circuit board assemblies, power electronics device assemblies, and power electronics assemblies comprising an S-cell that is fully embedded within a circuit board substrate. The S-cell of the embodiments described herein include an encapsulated graphite layer to improve thermal performance. Electrical isolation may be provided by electrically insulating components of the S-cell. The embedding of the power electronics device assemblies directly into the circuit board, as well as the removal of a separate electrical isolation layer between the circuit board and the cold plate, significantly reduces the overall size of the power electronics assembly while also providing enhanced thermal performance.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

The invention claimed is:
1. A power electronics assembly comprising:
 a circuit board assembly comprising:
  a substrate that is electrically insulating;
  a power electronics device assembly embedded in the substrate, the power electronics device assembly comprising:
   an S-cell comprising:
    an inner graphite layer;

a metal layer encasing the inner graphite layer; and a first surface of the metal layer comprising a recess provided within the first surface; and a power electronics device disposed within the recess of the first surface.

2. The power electronics assembly of claim 1, wherein the circuit board assembly further comprises a plurality of thermal vias embedded in the substrate and thermally coupled to the power electronics device.

3. The power electronics assembly of claim 1, wherein the S-cell has a length that is greater than a width.

4. The power electronics assembly of claim 1, further comprising a cold plate, wherein the circuit board assembly is bonded to a surface of the cold plate by a bond layer.

5. The power electronics assembly of claim 4, wherein the bond layer is electrically insulating.

6. The power electronics assembly of claim 4, wherein the bond layer is a RMS bond layer.

7. The power electronics assembly of claim 1, wherein the S-cell further comprises a metalized insulation layer bonded to a second surface of the metal layer.

8. The power electronics assembly of claim 7, further comprising a cold plate, wherein:

the metalized insulation layer of the S-cell is exposed at a surface of the circuit board assembly;

the circuit board assembly is bonded to a surface of the cold plate at the metalized insulation layer of the S-cell.

9. The power electronics assembly of claim 8, wherein the circuit board assembly is bonded to a surface of the cold plate at the metalized insulation layer of the S-cell by RMS bonding.

10. The power electronics assembly of claim 7, wherein the S-cell further comprises a second metal layer bonded to the metalized insulation layer.

11. The power electronics assembly of claim 10, wherein the circuit board assembly further comprises a plurality of thermal vias thermally coupled to the second metal layer.

12. The power electronics assembly of claim 1, wherein:

the S-cell further comprises a direct-bonded-metal substrate comprising:

a first DBM metal layer;

a ceramic layer bonded to the first DBM metal layer; and a second DBM metal layer bonded to the ceramic layer.

13. The power electronics assembly of claim 12, further comprising a cold plate, wherein:

the second DBM metal layer is exposed at a surface of the circuit board assembly; and the circuit board assembly is bonded to the first surface of the cold plate at the second DBM metal layer of the S-cell.

14. A power electronics assembly comprising:

a circuit board assembly comprising:

a substrate that is electrically insulating;

a plurality of power electronics device assemblies embedded in the substrate, each power electronics device assembly comprising:

an S-cell comprising:

an inner graphite layer;

a metal layer encasing the inner graphite layer;

an insulation layer bonded to a second surface of the metal layer; and a first surface of the metal layer comprising a recess provided within the first surface; and a power electronics device disposed within the recess of the first surface;

a surface metal layer on a surface of the substrate; and a plurality of thermal vias thermally coupling the S-cell to the surface metal layer; and a cold plate, wherein the surface metal layer of the circuit board assembly is bonded to a first surface of the cold plate.

15. The power electronics assembly of claim 14, wherein the S-cell has a length that is greater than a width.

16. The power electronics assembly of claim 14, wherein the insulation layer comprises a metalized insulation layer.

17. The power electronics assembly of claim 14, wherein the insulation layer comprises a direct-bonded-metal substrate comprising:

a first DBM metal layer;

a ceramic layer bonded to the first DBM metal layer; and a second DBM metal layer bonded to the ceramic layer.

18. The power electronics assembly of claim 14, further comprising further a capacitor affixed to a second surface of the cold plate that is opposite from the first surface.

19. The power electronics assembly of claim 14, wherein;

the cold plate comprises a fluid chamber, a fluid inlet, and a fluid outlet; and the fluid inlet and the fluid outlet are thermally coupled to the fluid chamber.

20. The power electronics assembly of claim 14, wherein the circuit board assembly is affixed to the first surface of the cold plate by fasteners and a thermal grease layer.

* * * * *

UNITED STATES PATENT AND TRADEMARK OFFICE
CERTIFICATE OF CORRECTION

PATENT NO. : 12,108,563 B2
APPLICATION NO. : 17/874462
DATED : October 1, 2024
INVENTOR(S) : Feng Zhou and Hiroshi Ukegawa It is certified that error appears in the above-identified patent and that said Letters Patent is hereby corrected as shown below:

In the Claims

In Column 10, Line(s) 28, Claim 15, delete "a" and insert --its--, therefor.

In Column 10, Line(s) 38, Claim 18, after "comprising", delete "further".

Signed and Sealed this
Twenty-sixth Day of November, 2024

Katherine Kelly Vidal
*Director of the United States Patent and Trademark Office*